United States Patent [19]

Cavaliere et al.

[11] Patent Number: 4,503,523

[45] Date of Patent: Mar. 5, 1985

[54] DYNAMIC REFERENCE POTENTIAL GENERATING CIRCUIT ARRANGEMENT

[75] Inventors: Joseph R. Cavaliere, Hopewell Jct.; Peter T. Liu, Hopewell, both of N.Y.

[73] Assignee: International Business Machines Corporation, Armonk, N.Y.

[21] Appl. No.: 393,965

[22] Filed: Jun. 30, 1982

[51] Int. Cl.$^3$ .............. G11C 7/00; G11C 11/24; G11C 11/40

[52] U.S. Cl. .................. 365/210; 365/207; 365/149

[58] Field of Search ............ 365/207, 208, 210, 149

[56] References Cited

U.S. PATENT DOCUMENTS 3,979,734  9/1976  Pricer et al. ............... 365/149
4,198,697  4/1980  Kuo et al. ................. 365/210

FOREIGN PATENT DOCUMENTS 0100233  7/1979  Japan ..................... 365/210

OTHER PUBLICATIONS

Selleck, "One Device Dynamic Bipolar Memory with Dummy Cells", IBM Tech. Disc. Bulletin, vol. 22, No. 7, Dec. 1979, pp. 2683–2686.
Wang, "Improved Dummy Cell for a Random Access Memory," IBM Tech. Disc. Bull., vol. 24, No. 1B, Jun. 1981, pp. 473–474.
Arzubi, "Sense Amplifier for Capacitive Storage", IBM Tech. Disc. Bulletin, vol. 19, No. 2, Jul. 1976, pp. 407–408.

Primary Examiner—Stuart N. Hecker
Assistant Examiner—Glenn Gossage
Attorney, Agent, or Firm—Robert J. Haase

[57] ABSTRACT

This dynamic reference potential generating circuit arrangement is especially adaptable to a binary data storage array of the type wherein each data storage cell comprises a single transistor and a single capacitor. A reference potential generating circuit for such an array comprises a pair of such identical transistors connected in parallel and a pair of identical capacitors, connected in common to the transistor emitter electrodes which capacitors couple the emitters to a digit line and to a refresh line, respectively. This arrangement develops a potential swing at the emitter electrodes equal to half of the potential swing that would develop at the emitter electrode of the transistor of a single data storage cell for the same signal swing on the digit line. Basically, the total capacitance connected to the emitter electrode of the generator circuit transistors is twice the capacitance connected to the emitter electrode of the transistor of a single storage cell. Therefore, the potential applied through the capacitor to the emitter electrode is exactly half of that applied through the capacitor connected to the storage cell transistor emitter electrode.

4 Claims, 6 Drawing Figures

DYNAMIC REFERENCE POTENTIAL GENERATING CIRCUIT ARRANGEMENT

FIELD

The invention relates to reference potential generating circuit arrangements and it particularly pertains to such circuit arrangements for binary electronic data storage arrays of the type wherein each storage cell comprises a single transistor and a single capacitor, each having an electrode directly connected to a word or a digit line in the array.

BACKGROUND

Differential sensing circuitry is preferred for determining the binary value stored in the capacitor of each cell. In most such sensing circuit arrangements, one input terminal is arranged to receive a potential level substantially equal to the binary value stored. The other input terminal of the sensing circuitry is arranged with fixed reference potential applied. Depending on the mode of operation desired, the sensing circuitry is arranged to deliver binary output levels proportional to the algebraic differences between the reference potential and the input potential values. A preferred mode is centered about a reference potential that is substantially midway of the binary value levels.

SUMMARY

The objects of the invention indirectly referred to above and those that will appear as the specification progresses are attained with a dynamic reference potential generating circuit arrangement for a binary data storage array especially of the type wherein each data storage cell comprises a single transistor and a single capacitor. A pair of such transistors and such capacitors are interconnected in the array for developing a potential equal to half of the logic signal potential swing. In accordance with the invention, the capacitors have one terminal connected in common to the emitter electrodes of both transistors in the generating arrangement. The other terminals of the capacitors couple the emitters to a digit line and to a refresh line, respectively. This arrangement develops a potential swing at the emitter electrodes equal to half of the potential swing that would develop at the emitter electrode of the transistor of a single data storage cell for the same signal swing on the digit line. Basically, the total capacitance connected to the emitter electrode of the generator circuit transistors is twice the capacitance connected to the emitter electrode of the transistor of a single storage cell. Therefore, the potential applied through the capacitor to the emitter electrode is exactly half of that applied through the capacitor connected to the storage cell transistor emitter electrode. Electric connections are made to the storage cell array for operating the generating circuitry with a minimum of additional external control.

Logical level potentials used to refresh data cells are also applied to the generating circuitry by means of conventional timed switching circuitry. It is a particular advantage with circuitry according to the invention that dual input terminal sensing circuitry is connected to a pair of selection lines of like nature and successive alterations with these lines with data first on one and reference potential on the other or by reference potential on the one and data on the other.

PRIOR ART

There is prior art showing circuit arrangements teaching concepts common to those underlying the circuit arrangements of the invention. Such art is found in U.S. Patents:

| | | | |
|---|---|---|---|
| 3,876,992 | 4/1975 | PRICER | 340/173CA |
| 3,979,734 | 9/1976 | PRICER, et al | 340/173CA |
| 4,103,342 | 7/1978 | MIERSCH, et al | 365/149 |
| 4,115,871 | 9/1978 | VARADI | 365/149 |
| 4,188,671 | 2/1980 | LYNES | 365/149 |
| 4,198,697 | 4/1980 | KUO, et al | 365/210 |
| 4,200,918 | 4/1980 | GLOCK, et al | 365/210 | and in the periodical literature:

J. E. Selleck, "One-device Dynamic Bipolar Memory with Dummy Cells"; IBM Technical Disclosure Bulletin, Vol. 22, Nr. 7; December 1979; pp. 2683-6.

W. Wang, "An Improved Dummy Cell for a Random Access Memory (RAM)"; IBM Technical Disclosure Bulletin, Vol. 24, Nr. 1B, June 1981, pp. 473-4.

The patents to Pricer, to Pricer and Selleck, and to Lynes are directed to matrix storage circuitry of the type to which the reference potential generating circuit is adaptable and are referred to for the background information. However, there is no suggestion of any reference potential generating circuitry to which the subject invention is directed.

The patent to Miersch and Spampinato is directed to circuitry having a plurality of field effect transistor devices arranged in a circuit which is arranged to obviate the need for a reference potential. Therefore, this arrangement is at best but superficially similar to that of the invention.

Reference potential generating circuitry is found in the patents to Varadi, to Kuo and Tsaur, and to Glock and Hartel. The first two are arranged with MOS transistor devices and not with bipolar transistor devices as in the circuitry according to the invention. The first patent disclosure teaches the use of a single capacitor for the generating circuitry that is smaller than the data storage capacitor. In either case, but a single capacitor is used as against a pair in the circuitry of the invention.

The Glock and Hartel patent teaches the use of a "reference cell identical to the storage cells" and further teaches that a predetermined current be passed through the reference cell and the data storage cell, which is contrary to the operation of the circuitry according to the invention.

The publication to Wang is directed to a semiconductor device that provides the "halving" equivalent of reference potential generating circuitry for field effect device circuit arrangements. Two data cells are connected together but only by means of a third field effect transistor device.

The closest prior art appears to be found in the publication to Selleck wherein a reference cell comprises a single data cell whereby the reference potential is more representative of data potential. However, a fully charged value is had in contrast to the desired half-value provided by the circuit according to the invention.

DRAWING

In order that the full advantage of the invention obtain in practice, a preferred embodiment is described hereinafter with reference to the accompanying drawing, forming a part of the specification, and in which.

DESCRIPTION

Figure 1:
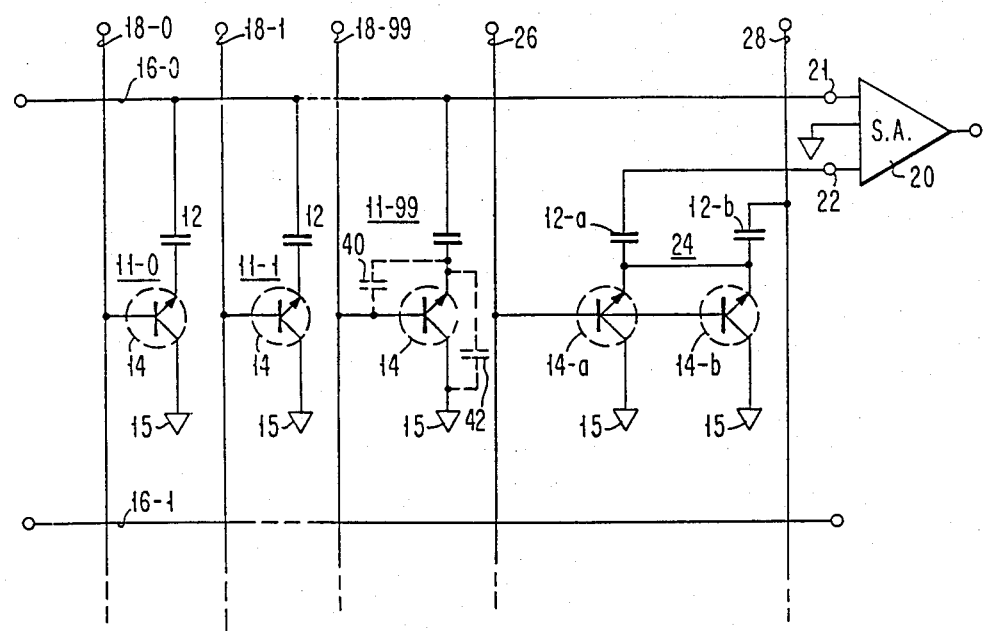
FIG. 1 is a schematic diagram illustrating the basic circuit arrangement of the invention.

The basic structure of the circuit arrangement according to the invention are illustrated in FIG. 1 in which there is depicted only a portion of a planar array of a multiple of storage cells 11-0, 11-1–11-99. Each cell 11 is formed of a capacitor 12 and a bipolar transistor 14. All of the capacitors 12 and all of the transistors 14 shown are as identical to each other as is possible with the fabrication process used and in keeping with the required tolerances. The collector electrode of each transistor 14 is connected to a point of fixed reference potential 15 which is common to all. The emitter electrode of each transistor 14 is formed at one electrode of the associated capacitor 12 as shown, the other electrode of which is connected to a digit line 16 as shown. The base electrode of the transistor 14 in each cell is connected to a word line 18 as shown. Each digit line terminates at a sensing circuit arrangement 20 of the differential input type which is entirely conventional. Digit line data is applied to one input terminal 21 as shown and reference potential is applied to the other input terminal 22.

It is desirable that the reference potential applied to the input terminal 22 be one-half of the data potential swing at the input terminal 21. In one example of an operating circuit, the data potential swing is from 0.95 volt to 1.03 volts, from which the half-value sought is 0.99 volt. In accordance with the invention, this reference value is derived with a generating circuit arrangement 24 comprising two capacitors 12 and two transistors 14, referenced specifically in the drawing as capacitors 12a, 12b and transistors 14a, 14b in the interest of clarity. The collector electrodes are connected in common with those of all of the other transistors 14. The base electrodes are connected together and to a line 26, the operation of which will be more fully described later. It should be noted that the potential appearing at the emitter electrodes of the transistors 14a and 14b due to the swing of the refresh line 28 is exactly one-half of the potential appearing at the emitter electrode of any transistor 14 due to an equal swing on the digit line 16. This is because the total capacitance connected to the emitter electrodes of the generator transistors 14a and 14b is twice the capacitance that is connected to the emitter electrode of any transistor 14.

Each transistor 14 has a base-emitter circuit capacitance 40 indicated only in cell 11-99 and has an emitter-collector circuit capacitance 42 likewise indicated. The manner in which these two capacitances enter into the circuit according to the invention is readily apparent mathematically.

$$V_C = V_D \frac{C_{12}}{C_{12} + C_{40} + C_{42}} \quad (1)$$

and $$V_R = V_D \frac{C_{12}}{2C_{12} + 2C_{40} + 2C_{42}} = \frac{1}{2} V_D \frac{C_{12}}{C_{12} + C_{40} + C_{42}} \quad (2)$$

where $V_C$ is the potential swing at the emitter electrode-storage capacitor node at the storage cell;

$V_D$ is "data" applied to the respective digit lines; (that is, the *signal* data in equation (1) and the *reference* datum in equation (2).);

$V_R$ is the potential swing at the emitter electrodes of the generator cell; and $C_{12}$, $C_{40}$ and $C_{42}$ are the capacitances of the capacitors indicated by the subscript reference numerals.

Inasmuch as the storage capacitances are equal to each other, and since the transistors with their associated inherent capacitances are also equal to each other, all capacitances track each other despite manufacturing process variations with the result that the potential swing of the generator cell always exactly equals ½ of the potential swing of the storage cell. Therefore, despite the stray capacitances, the reference potential generated is always exactly one-half the data value, no matter what the value swing.

PRACTICAL EMBODIMENTS

The circuit arrangement thus far shown and described will now be seen to be quite practical for incorporation into known storage arrays in such manner that a very minimum of control lines are used.

Figure 2:
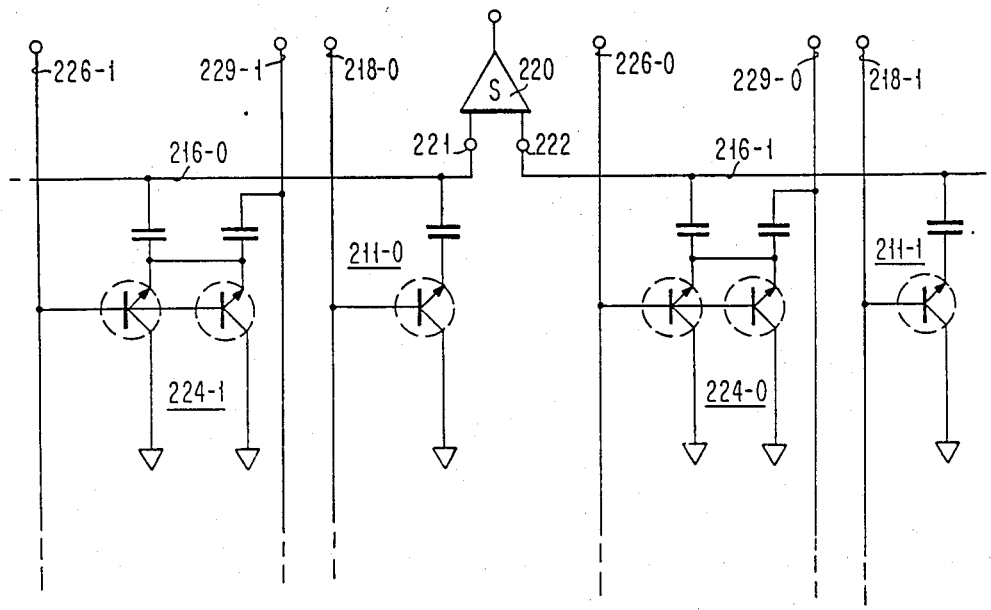
FIG. 2 is a schematic diagram of an embodiment of the invention.

For example, the application of circuitry according to the invention to a known format of matrix storage circuitry is shown in FIG. 2. Two digit lines 216-0 and 216-1 are connected individually to input terminals of sensing circuitry 220 in a manner in which one sensing circuit is shared by two digit lines. Two cells 211-0 and 211-1 only are shown individually connected to bit lines 216-0 and 216-1 to which two generating circuits according to the invention 224-1 and 224-0 respectively are connected. The word line 218-0 and reference line 226-0 are activated for applying data and reference potentials to the input terminals 221 and 222 respectively of the sensing circuitry 220 in one sensing operation. In a subsequent operation, word line 218-1 and the reference line 226-1 are activated for applying reference level and data potentials to the respective input terminals.

The arrangement shown in FIG. 2 is readily put in operation by one skilled in the art using conventional pulse generating circuitry and control logical blocks. One example of operating waveforms is seen by referring to FIG. 3. Three curves 300, 310 and 320 related to data storage cells 211-0, 211-1 and the like. The selection potentials $V_W$ applied to word lines 218-0, 218-1 and the like are represented by the curve 300; the node potential $V_N$ appearing at the emitter electrodes of the transistors 211-0, 211-1 and the like is represented by the curve 320; and the potentials $V_D$ applied to the digit lines 216-0 and 216-1 and the like are represented by the curve 310.

Referring to FIG. 4, three sub-circuits, equivalent to the reference generating circuit at different times, are shown as an aid to understanding the material following.

Figures 4A, 4B:
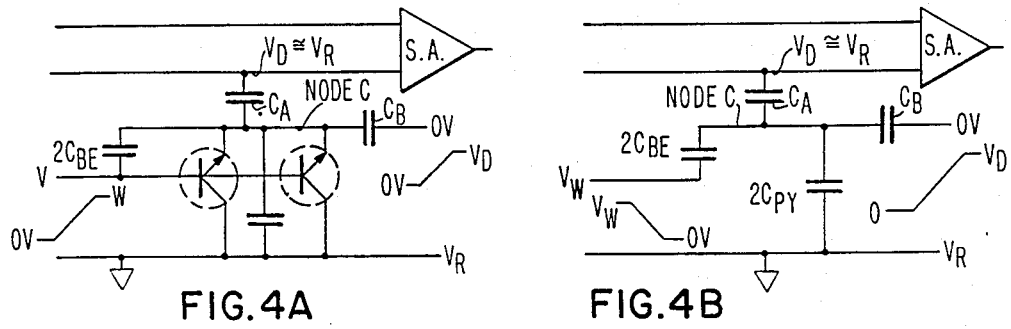
FIG. 4 (FIGS. 4A, 4B and 4C being taken together) is a schematic diagram depicting changes in equivalent circuitry in the operation of the invention.

FIG. 4A shows an equivalent subcircuit for a first phase of operation. After the rise time of the signal applied to the base electrodes of the transistors indicated as W, the node at the emitter electrodes and one terminal of each capacitor is at the potential $V_R$ or the subcollector reference potential. This is obtained through the conducting transistors providing a very low impedance to the subcollector.

FIG. 4B shows the equivalent subcircuit for the next phase. The word line is brought to zero, that is $V_W=0$. Because the transistors are turned off, the circuit is as shown and the driving source is the word W.

Now there will be a dividing action because of the potential change on word line W.

Thus the ratio equation is given by:

$$\theta_{WL} = \frac{2C_{BE}}{2C_{BE} + 2C_{PY} + 2C} \quad (3)$$

or $$\theta_{WL} = \frac{C_{BE}}{C_{BE} + C_{PY} + C} \quad (4)$$

which is the same equation as for the storage cell. The word line dividing factor (3) above times the potential change on the word line gives the voltage on the emitter electrode of the generating cell (node C), even though the schematic of the generator cell is different from that of the storage cell.

Figure 4C:
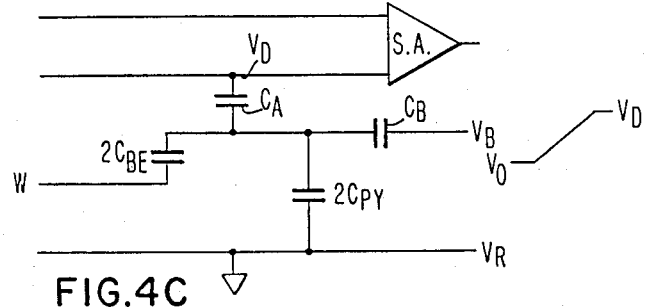

FIG. 4C shows the third phase in which the schematic diagram appears to be the same but the driving point is now from the generator "digit" line which is brought to the potential $V_D$.

Therefore a new dividing equation results.

$$\theta_{DB} = \frac{C_B}{2C_{BE} + 2C_{PY} + 2C} \quad (5)$$

Since $C_A = C_B = C$ $$\theta_{DB} = \frac{C}{2(C_{BE} + C_{PY} + C)} \quad (6)$$

During this time in the sequence the $\frac{1}{2}$ voltage reference at node C obtains $$\theta_{DB} = \tfrac{1}{2}\theta_w \quad (7)$$

which is exactly midway between a "1" level and a "0" level in the storage cell.

Figure 3:
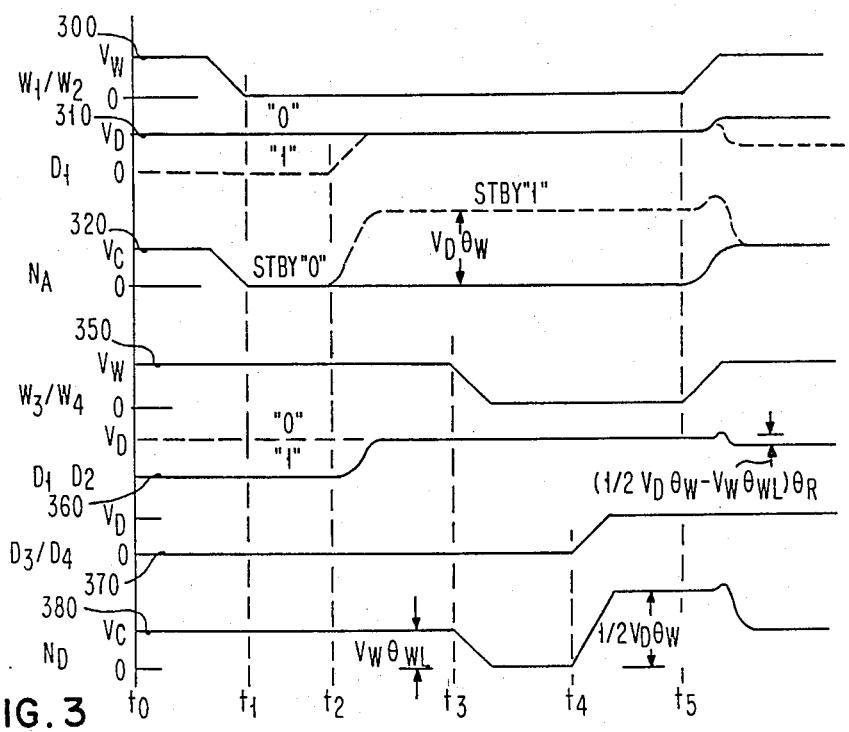
FIG. 3 is a graphical representation of waveforms useful in an understanding of the operation of an embodiment of the invention.

Referring now to FIG. 3 at the time, $t_1$, the word line is dropped from $V_w (=1.8$ v, for example) to zero, This brings the node potential to a value of $V_R - V_W \theta_{WL}$ where $$\theta_{WL} = \frac{C_{40}}{C_{12} + C_{40} + C_{42}} \quad (8)$$

At the time $t_2$, if a binary naught (0) is being recorded, the bit line potential already is at $V_D$ and the storage node will stay at the standby "0" level. However, if a binary unit (1) is being recorded, the bit line returns to $V_D$ which raises the storage node potential through an increment of $V_D \theta_W$ above the standby "0" level to the standby "1" level. where $$\theta_W = \frac{C_{12}}{C_{12} + C_{40} + C_{42}} \quad (9)$$

Four curves 350, 360, 370 and 380 depict operation of the reference potential generating circuits 224-0, 224-1 and the like. Selective potentials applied to the reference lines 226-0 and 226-1 and the like are represented by the curve 350; the potentials on the bit line 216-1 in supplying reference potential is represented by a curve 360; refresh lines 229-0, 229-1 and the like are represented by the curve 370, and node potential at the junctions of the capacitors and the emitter electrodes of the transistors forming the generator 224-1 are represented by a curve 380.

At the time $t_3$, the reference generator line 226-0 is dropped from $V_W$ to zero as represented by the curve 350, which indicates the application of potential of value $V_W \theta_{WL}$ to the node at the junction of the capacitor definable and the emitter electrode of the transistor of the generator cell 224-0. This definable value is $V_W \theta_{WL}$.

At the time $t_4$, the refresh line 229-0 is returned to $V_D$ as shown by the curve 370, which indicates the positive application of potential to the node at the junction between the capacitor and the emitter electrode of the transistor of the generator cell 224-0 having a value $$V_C = V_D \frac{C_{12}}{2C_{12} + 2C_{40} + 2C_{42}} = \tfrac{1}{2} V_D \theta_W \quad (10)$$

This exactly half-value, of potential reference instead of full value, is an exactly tracking reference potential. The digit lines are now floating as they must be before readout is possible.

At the time $t_5$, both lines 218-0 and 226-0 are raised to the potential $V_W$, resulting in all nodes to attain charge $V_C$. In turn, sense potential is coupled to the bit lines.

The coupled potential $V_{DO}$ corresponding to binary naught (0) is of value $$V_{DO} = -V_W \theta_{WL} \theta_R \quad (11)$$

and where $\theta_R = \dfrac{C_{12}}{C_{12} + C_D}$ and $C_D$ is the capacitance of the digit line.

The coupled potential $V_{D1}$ corresponding to binary unit (1) is of value $$V_{D1} = (V_D \theta_W - V_W \theta_{WL}) \theta_R \quad (12)$$

The average potential lying between the corresponding binary values 1 and 0 is $$V_D = (\tfrac{1}{2} V_D \theta_W - V_W \theta_{WL}) \theta_R \quad (13)$$

and the potential of the reference cell $V_{or}$ is of value $$V_{DR} = (\tfrac{1}{2} V_D \theta_W - V_W \theta_L) \theta_R \quad (14)$$

which is the same as for equation (13) above.

While the invention has been described in terms of express embodiments, and alternatives have been suggested, it is clearly to be understood that those skilled in the art will effect further changes in form and in substance without departing from the spirit and scope of the invention as defined in the appended claims concluding the specification.

The invention claimed is:

1. A dynamic reference potential generating circuit arrangement particularly for use in an electronic binary data storge array of the type having a multiple of cells, each comprising a transistor and a capacitor connected to word and digit lines to which differential sensing circuitry is attached, said arrangement comprising,
a reference line,
a refresh line,
a point of fixed reference potential,
a pair of said transistors each having emitter, base and collector electrodes,
circuitry interconnecting said emitter electrodes,
circuitry connecting said base electrodes to said reference line,
circuitry connecting said collector electrodes to said point of fixed reference potential,
a pair of capacitors having given electrodes connected in common to said emitter electrodes and having one of said other electrodes connected to one of said digit lines, and
circuitry connecting the other of said other electrodes to said refresh line.

2. An electronic binary data storage array comprising
a multiple of word lines,
a multiple of digit lines,
at least one reference line,
at least one refresh line,
a multiple of storage capacitors, and
a multiple of transistors each having an emitter electrode, a base electrode and a collector electrode,
a binary data storage section comprising a multiple of cells,
each cell comprising a single one of said capacitors and a single one of said transistors with the emitter-collector circuit and the capacitor connected in series between a digit line and a point of fixed reference potential and with the base electrode connected to a word line,
a storage cell sensing section comprising electronic circuitry having a pair of differential input terminals and having an output terminal with one of said input terminals coupled to a digit line and the other input terminal available for dynamic reference potential, and
reference potential generating section comprising
two of said capacitors connected in series between said refresh line and said other input terminal of said electronic sensing circuitry, and
two of said transistors connected in parallel between the junction point between said series connected capacitors and said point of fixed reference potential,
the bases of said two transistors being commonly connected to said reference line.

3. A dynamic reference potential generating circuit arrangement for connection to a
sensing circuit via a bit line, to a refresh line, to a reference line and to a source of potential,
said circuit arrangement comprising
a pair of bipolar transistors each having a base, a collector and an emitter electrode,
said emitter electrodes being connected together,
said collector electrodes being connected together to said source of potential,
said base electrodes being connected together to said reference line,
a pair of capacitors,
one of said capacitors connecting said emitter electrodes to said bit line and the other of said capacitors connecting said emitter electrodes to said refresh line.

4. A dynamic reference potential generating circuit as defined in claim 3 and wherein
said sensing circuit is a differential amplifying circuit arrangement.

* * * * *